United States Patent
Tokumo et al.

[11] Patent Number: 5,343,161
[45] Date of Patent: Aug. 30, 1994

[54] POWER AMPLIFIER APPARATUS

[75] Inventors: Akio Tokumo; Masayuki Kato, both of Saitama, Japan

[73] Assignee: Pioneer Electronic Corporation, Tokyo, Japan

[21] Appl. No.: 60,056

[22] Filed: May 13, 1993

[30] Foreign Application Priority Data

May 14, 1992 [JP] Japan .................. 4-121724

[51] Int. Cl.$^5$ ............ H03F 3/393; H03F 1/36; H03F 3/217; H03F 21/00
[52] U.S. Cl. ..................... 330/10; 330/110; 330/251; 330/306; 330/207 A
[58] Field of Search ............ 330/10, 110, 251, 306, 330/207 A; 307/260, 261, 354, 355, 356, 358

[56] References Cited

U.S. PATENT DOCUMENTS 4,379,240 4/1983 Mammano .................. 307/356
5,077,539 12/1991 Howatt .

Primary Examiner—William L. Sikes
Assistant Examiner—Fetsum Abraham
Attorney, Agent, or Firm—Sughrue, Mion, Zinn, Macpeak & Seas

[57] ABSTRACT

A power amplifier apparatus having an operational amplifier which works as a PWM (pulse width modulation) amplifier as well as an analog amplifier according to an input signal level to miniaturize the size of the apparatus and to maintain amplifying function thereof at the changeover of the function, which allows gain and frequency characteristic of the operational amplifier to have continuity before and after the changeover. The power amplifier apparatus according to the present invention comprising: an operational amplifier having two input terminals, an input signal being inputted to one of the input terminals; a triangular waveform generator for outputting voltage with triangular waveform; an input signal level detecting circuit for applying the voltage with triangular waveform from the triangular waveform generator to the other input terminal of the operational amplifier; a broadband power amplifier for amplifying an output of the operational amplifier; and a low-pass filter connected to an output terminal of the broadband power amplifier.

1 Claim, 3 Drawing Sheets

POWER AMPLIFIER APPARATUS

BACKGROUND OF THE INVENTION

1. Field of the Invention

The present invention relates to a power amplifier apparatus, and more particularly to, a power amplifier apparatus in which an operational amplifier works as a PWM (pulse width modulation) amplifier as well as an analog amplifier according to an input signal level.

2. Description of the Prior Art

FIG. 3 is a block diagram showing a conventional power amplifier apparatus. In the figure, denoted 1 is an input terminal to which an input signal is inputted, 2 is a PWM amplifier for amplifying the input signal inputted to the input terminal 1, and 3 an analog amplifier for amplifying the input signal which is inputted to the input terminal 1.

A reference numeral 4 shows an input signal level detector for detecting the level of the input signal inputted in the input terminal 1. When the level of the input signal exceeds a selected level, driving signals are outputted during the input signal level is larger than the selected level. On the other hand, when the input signal level becomes lower than the selected level, non-driving signals are outputted during the input signal level is smaller than the selected level.

Numeral 5 shows a changeover switch. A contact 5a is connected to an output terminal of the PWM amplifier 2, and a contact 5b to an output terminal of the analog amplifier 3. Further, a movable contact 5c is switched between the contacts 5a and 5b with the output of the input signal level detector 4.

Numeral 6 shows a low-pass filter (LPF), of which end is connected to the movable contact 5c of the changeover switch. Denoted 7 is a load connected to the other end of the low-pass filter.

Next, the operation of the power amplifier apparatus will be explained.

An input signal is inputted to the input terminal and the input signals are amplified by the PWM amplifier 2 or the analog amplifier 3. Then, the input signal level detector 4 detects the level of the input signal. When the input signal level is lower than the selected level, the movable contact 5c of the changeover switch 5 is changed to the contact 5b to out put a non-driving control signal and when the input signal level is larger than the selected level the movable contact 5c is changed to the contact 5a to output a driving control signal.

As a result, when the input signal level is lower than the selected level, the input signal is amplified by the analog amplifier 3 and is inputted to a load 7 by way of the changeover switch 5 and the low-pass filter 6. When the input signal level is larger than the selected level, the input signal is amplified by the PWM amplifier 2 and is inputted to the load 7 through the changeover switch 5 and the low-pass filter 6.

The cut-off frequency of the low-pass filter 6 is set, for example, between 20 kHz and 50 kHz so as to cut off a carrier through the PWM amplifier 3. As a result, even if the output of the analog amplifier is provided to the low-pass filter 6, is does not have bad effect on the output of the low-pass filter 6. Such power amplifier apparatus as described above is disclosed in U.S. Pat. No. 5,077,539.

In the conventional power amplifier apparatus with the above configuration, an amplifier which is operated with the level of the input signal is changed between a PWM amplifier and an analog amplifier, which requires two line with the PWM amplifier 2 and the analog amplifier 3, resulting in rather large-sized apparatus.

Further, unless the PWM amplifier 2 and the analog amplifier 3 are not provided with the same characteristics, the characteristics of the PWM amplifier 2 and the analog amplifier 3 becomes discontinuous when one of the amplifiers is changed to the other amplifier, causing a trouble such as a noise.

SUMMARY OF THE INVENTION

The present invention has been accomplished to the above drawbacks and the object thereof is to provide a power amplifier apparatus with a small scale in which the characteristics thereof does not change at the changeover of the amplifiers, and the gain and the frequency characteristic are maintained before and after the changeover.

In order to accomplish the above objective, the power amplifier apparatus according to the present invention comprises: an operational amplifier having two input terminals, an input signal being inputted to one of the input terminals; a triangular waveform generator for outputting voltage with triangular waveform; an input signal level detecting circuit for applying the voltage with triangular waveform from the triangular waveform generator to the other input terminal of the operational amplifier; a broadband power amplifier for amplifying an output of the operational amplifier; and a low-pass filter connected to an output terminal of the broadband power amplifier.

The input signal level detector according to the present invention applies the voltage with triangular waveform to the other input terminal of the operational amplifier when the level of the input signal exceeds the selected level. Further, when the level of the input signal becomes lower than the selected level, the voltage with triangular waveform is not applied to the other input terminal of the operational amplifier. As a result, the operational amplifier works as a PWM amplifier when the input signal and the voltage with triangular waveform is inputted, and works as a analog amplifier when only the input signal is inputted.

BRIEF DESCRIPTION OF THE DRAWINGS

The present invention will be more apparent from the ensuring description with reference to the accompanying drawing wherein.

DETAILED DESCRIPTION OF PREFERRED EMBODIMENTS

Now, the first embodiment of the present invention will be explained with reference to drawings.

Figure 1:
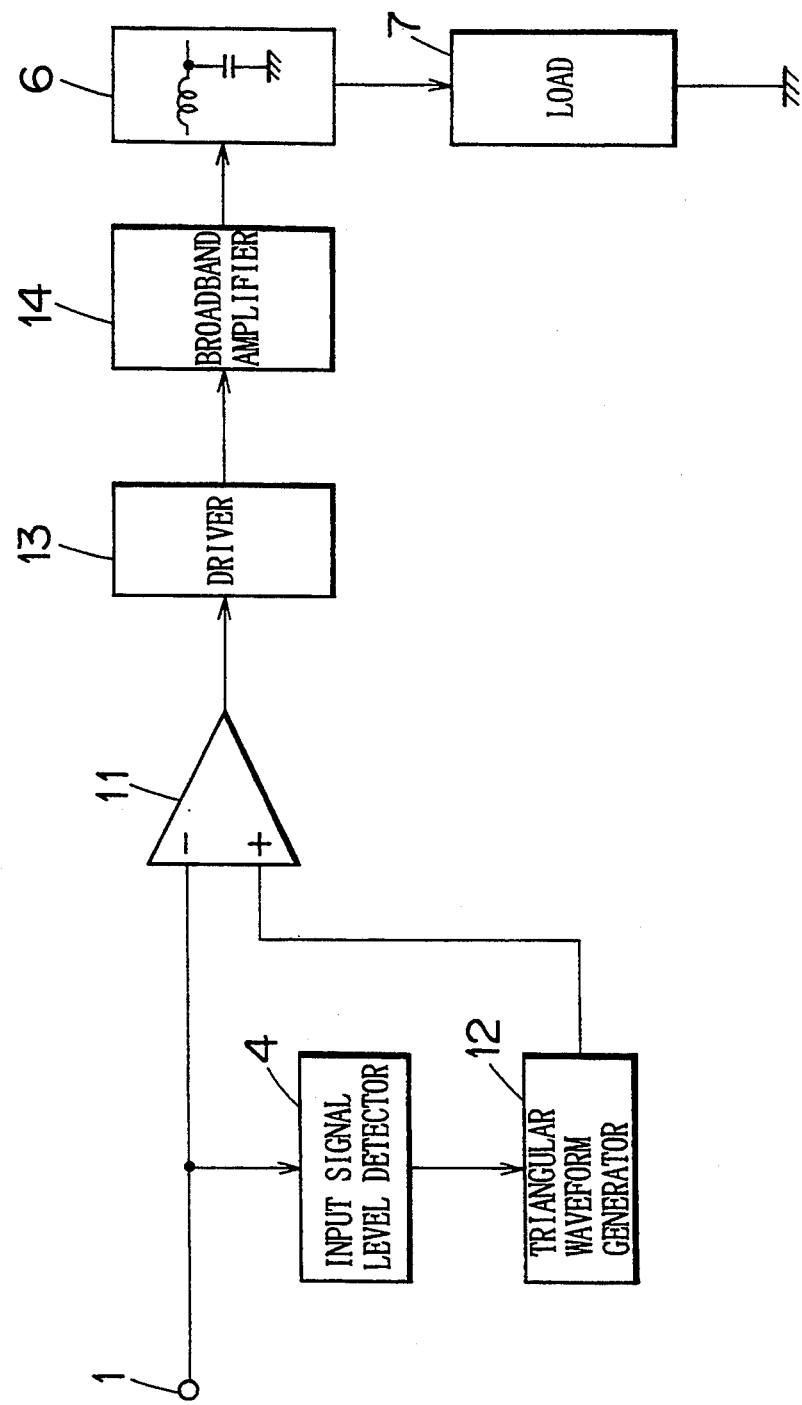
FIG. 1 is a block diagram showing the configuration of the power amplifier apparatus according to a first embodiment of the present invention.
Figure 3:
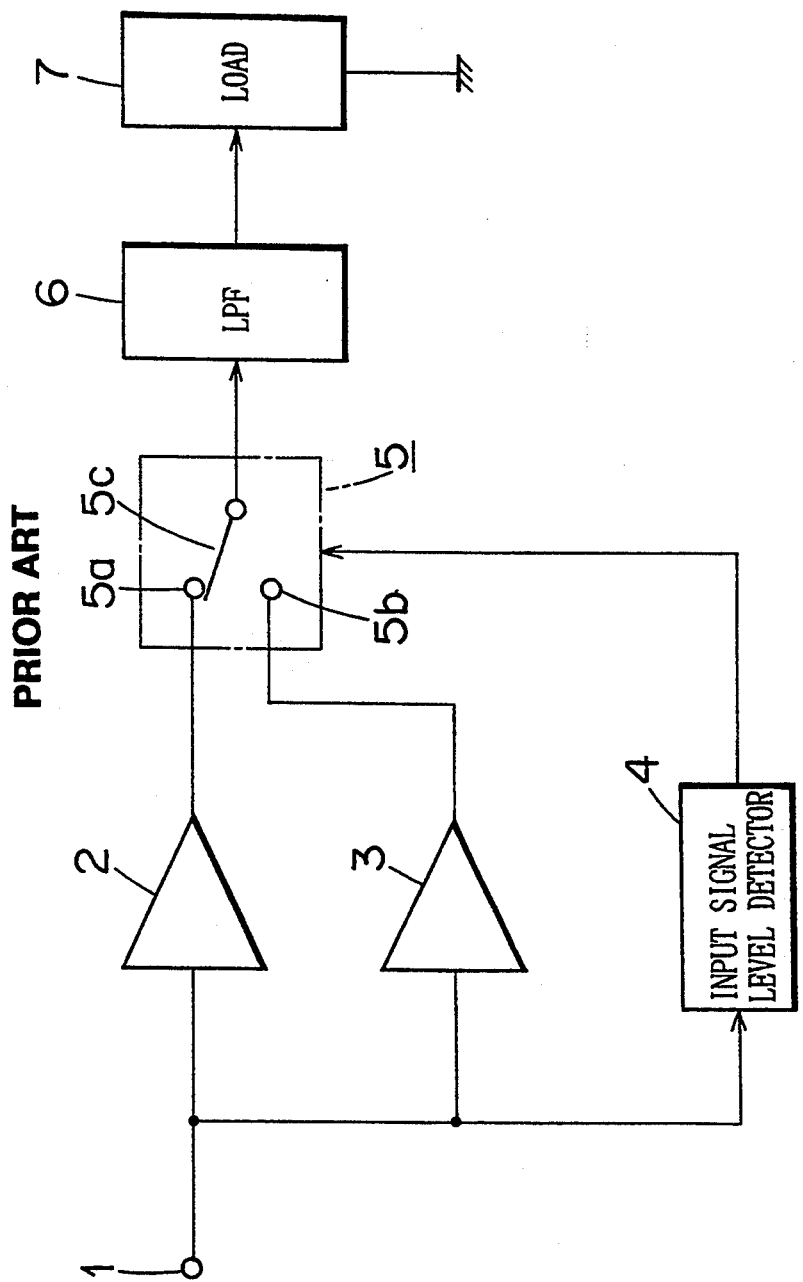
FIG. 3 is a block diagram of the configuration of a conventional power amplifier apparatus.

FIG. 1 is a block diagram showing the configuration of the power amplifier apparatus according to the first embodiment of the present invention In the figure, like reference characters designate like or corresponding parts shown in FIG. 3, and the explanation thereof will be omitted.

In FIG. 1, denoted 11 is an operational amplifier and an input signal is inputted from an input terminal 1 to a negated input terminal of the amplifier 11.

Reference numeral 2 shows a triangular waveform generator. When a driving signal is inputted to the triangular waveform generator 12 from an input signal level detecting circuit 4, voltage with triangular waveform is applied to a non-negated input terminal of the operational amplifier 11. On the other hand, if a non-driving signal is inputted to the triangular waveform generator 12 from the input signal level detecting circuit 4, the voltage with a triangular waveform is not applied to a non-negated input terminal of the operational amplifier 11.

Numeral 13 shows a driver which drives a broadband power amplifier 14 according to the output of the operational amplifier 11 to provide the output of the broadband power amplifier 14 to the low-pass filter 6.

Next, the operation of the above amplifier apparatus will be explained.

After inputted to the input signal terminal, the input signals are further inputted to the negated input terminal of the operational amplifier 11 and to the input signal level detecting circuit 4.

The input signal detecting circuit 4 to which the input signal are inputted allows the driving signal to be outputted to the triangular waveform generator 12 when the input signal level exceeds a selected level, so that the voltage with triangular waveform is applied to the non-negated input terminal of the operational amplifier 11. On the other hand, the input signal level becomes lower than the selected level, the non-driving signal is outputted to the triangular waveform generator 12 to stop applying the voltage with a triangular waveform to the non-negated input terminal.

Then, when the voltage with triangular waveform is applied to the operational amplifier to which the input signal is inputted at the negated input terminal thereof, the amplifier 11 works as a PWM amplifier. However, when the voltage with a triangular waveform is not applied to the non-negated input terminal of the triangular waveform generator 12, the amplifier 11 functions as an analog amplifier to amplify the input signals. The driver 13 to which the output of the operational amplifier 11 is inputted operates the broadband amplifier 14 and provides the output thereof to the low-pass filter 6.

As described above, according to the above embodiment of the present invention, when the level of the input signal becomes larger than the selected value, the voltage with triangular waveform is applied to the non-negated input terminal of the operational amplifier 11. On the other hand, when the input signal level is reduced below the selected level, the voltage with a triangular waveform is not applied to the non-negated input terminal of the operational amplifier 11. Thus the operational amplifier 11 functions as a PWM amplifier or as an analog amplifier depending on the level of the input signal. As a result, the single operational amplifier 11 can be used as a PWM amplifier as well as an analog amplifier to miniaturize the apparatus.

Furthermore, since the operational amplifier 11 has a function as both a PWM amplifier and an analog amplifier, even if the function of the operational amplifier 11 from a PWM amplifier to an analog amplifier, or, from an analog amplifier to a PWM amplifier, the characteristic of the operational amplifier 11 does not change before and after the changeover. Furthermore, noise is prevented and the frequency characteristic of the amplifier 11 is also maintained at the changeover.

Figure 2:
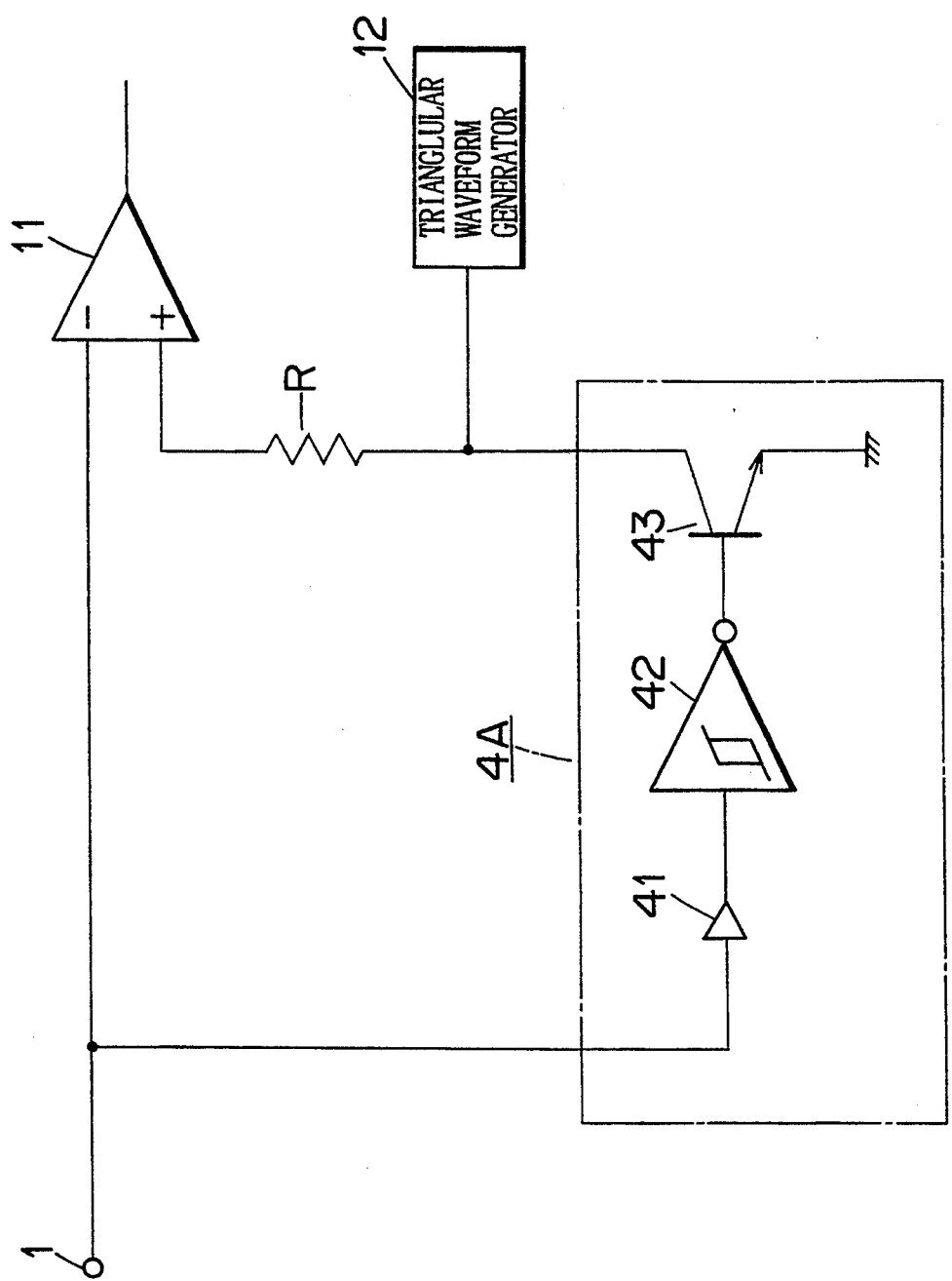
FIG. 2 is a block diagram showing the configuration of a second embodiment of the present invention.

FIG. 2 is a block diagram showing the configuration of a power amplifier apparatus according to the second embodiment of the present invention.

In FIG. 2, reference symbol 4A shows an input signal level detecting circuit having a hysteresis characteristic, which comprises a diode 41 for rectifying signals inputted to the input terminal 1, a Schmitt circuit 42 to which an output of the diode 41 is provided, and an N-P-N type transistor 43 in which an output of the Schmitt circuit 42 is applied to a base thereof. A collector of the transistor 43 is connected to an output terminal of the triangular waveform generator 12 and an emitter thereof is grounded.

A first level where the level of the input signal is increased to make the transistor a non-conductive condition is determined to have a value different from a second level where the input signal level is decreased to make the transistor a conductive condition. The second level is set lower than the first level to provide a hysteresis character.

Reference symbol R shows a resistor, which is disposed between the non-negated input terminal of the operational amplifier 11 and a junction of the output terminal of the triangular waveform generator 12 and the collector of the transistor 13.

Next, the operation of the power amplifier apparatus according to the second embodiment of the present invention.

The input signal is inputted to the input signal level detecting circuit 4A with the structure described above, and until the level of the input signal is increased up to the first level or when the level of the input signal is decreased lower than the second level, the transistor becomes the conductive condition, which stops applying the voltage from the triangular waveform generator 12 to the non-negated input terminal of the operational amplifier 11.

Meanwhile, when the level of the input signal increases up to the first level, or until the level of the input signal decreases to the second level, the transistor becomes non-conductive condition, permitting the voltage from the triangular waveform generator to apply the non-negated input terminal of the operational amplifier 11.

As described above, in the embodiments according to the present invention, a gap is provided between the first level, where a hysteresis characteristic is applied to the input signal level detecting circuit 4A to make the transistor 43 the conductive condition, and the second level for allowing the transistor 43 to be the non-conductive condition. As a result, even if the level of the input signals fluctuates, the number of times that the amplifying function of the operational amplifier 11 is changed are reduced to decrease the noise caused by the changeover of the amplifying function of the operational amplifier 11.

In the embodiment shown in FIG. 1, the explanation was made under the condition that the triangular waveform generating circuit 12 is always switched on. However, the triangular waveform generating circuit 12 may be switched on according to the driving signal from the input signal level detecting circuit 4 or switched off by the non-driving signal from the circuit 4. Further, the triangular waveform generating circuit may be switched on or off according the output of the input signal level detecting circuit 4A shown in FIG. 4.

The power amplifier apparatus according to the present invention described above comprises: an operational amplifier having two input terminals, an input signal being inputted to one of the input terminals; a triangular waveform generator for outputting voltage with triangular waveform; an input signal level detecting circuit for applying the voltage with triangular waveform from the triangular waveform generator to the other input terminal of the operational amplifier; a broadband power amplifier for amplifying an output of the operational amplifier; and a low-pass filter connected to an output terminal of the broadband power amplifier. As a result, the power amplifier apparatus can be reduced in size since the operational amplifier can be used as a PWM amplifier and as an analog amplifier.

Furthermore, the operation amplifier, which is to be used as a PWM amplifier and as an analog amplifier, maintains the amplifying characteristic thereof even when the amplifying function is changed from the PWM amplifier to the analog function, or, from the analog function to the PWM function, which not only prevents noise at the changeover of the amplifying function but also coincides frequency characteristics before and after the changeover.

What is claimed is:

1. A power amplifier apparatus comprising:

an operational amplifier having two input terminals, an input signal being inputted to one of said input terminals;

a triangular waveform generator for outputting voltage with triangular waveform;

an input signal level detecting circuit for applying said voltage with triangular waveform from said triangular waveform generator to the other input terminal of said operational amplifier;

a broadband power amplifier for amplifying an output of said operational amplifier; and a low-pass filter connected to an output terminal of said broadband power amplifier.

* * * * *